US009692393B2

(12) United States Patent
Johansson et al.

(10) Patent No.: US 9,692,393 B2
(45) Date of Patent: *Jun. 27, 2017

(54) RADIO COMMUNICATION RECEIVER APPARATUS AND METHOD

(75) Inventors: Bernt Johansson, Värmdö (SE); Bo Berglund, Uppsala (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 14/397,716

(22) PCT Filed: May 3, 2012

(86) PCT No.: PCT/SE2012/050465
§ 371 (c)(1),
(2), (4) Date: Oct. 29, 2014

(87) PCT Pub. No.: WO2013/165289
PCT Pub. Date: Nov. 7, 2013

(65) Prior Publication Data
US 2015/0087253 A1  Mar. 26, 2015

(51) Int. Cl.
*H04B 1/00* (2006.01)
*H04B 7/08* (2006.01)
*H03J 7/02* (2006.01)

(52) U.S. Cl.
CPC .............. *H03J 7/02* (2013.01); *H04B 1/0007* (2013.01); *H04B 1/0067* (2013.01)

(58) Field of Classification Search
CPC ........ H04B 1/007; H04B 1/0067; H04B 1/26; H04B 7/0817; H04L 1/0631; H04L 1/02
See application file for complete search history.

(56) References Cited

U.S. PATENT DOCUMENTS 6,466,153 B1 * 10/2002 Yu ....................... H03M 1/0673
341/120
6,574,459 B1 * 6/2003 Kaminski .............. H04B 7/084
455/266

(Continued)

FOREIGN PATENT DOCUMENTS

EP      1435687 A1      7/2004
EP      2528293 A1     11/2012
WO   WO 2012/066369 A1   5/2012

OTHER PUBLICATIONS

International Search Report for International Application No. PCT/SE2012/050465 mailed Apr. 29, 2013, 4 pages.

(Continued)

*Primary Examiner* — Andrew Wendell
(74) *Attorney, Agent, or Firm* — Patent Portfolio Builders, PLLC

(57) ABSTRACT

A radio communication receiver apparatus is configured to process multiple radio frequency bands in a telecommunication system. The apparatus includes a plurality of digital receiver chains wherein each digital receiver chain is coupled to receive a digital representation of the multiple radio frequency bands, including a particular radio frequency band for processing by the respective digital receiver chain. Each digital receiver chain includes a digital receiver that is programmable to select a particular radio frequency band from the digital representation of the multiple radio frequency bands, and configured to down convert the selected radio frequency band into a digital baseband signal associated with the particular radio frequency band. Built in calibration is provided by operation of direct radio frequency technology.

15 Claims, 8 Drawing Sheets

(56) References Cited

U.S. PATENT DOCUMENTS

| | | | | |
|---|---|---|---|---|
| 6,970,709 | B1* | 11/2005 | Williams | H04W 88/08 455/450 |
| 8,923,370 | B2* | 12/2014 | Johansson | H04B 1/0007 375/219 |
| 2002/0001357 | A1* | 1/2002 | Ohsawa | H04H 40/27 375/354 |
| 2004/0022332 | A1 | 2/2004 | Gupta et al. | |
| 2004/0036637 | A1 | 2/2004 | Singvall et al. | |
| 2006/0030277 | A1 | 2/2006 | Cyr et al. | |
| 2008/0101503 | A1 | 5/2008 | Gupta | |
| 2008/0107213 | A1* | 5/2008 | Gupta | H03K 17/92 375/340 |
| 2008/0248770 | A1* | 10/2008 | Schultz | H04B 1/005 455/188.1 |
| 2009/0042524 | A1* | 2/2009 | Maiuzzo | H04B 1/1036 455/188.1 |
| 2010/0261438 | A1 | 10/2010 | Walley et al. | |
| 2011/0059704 | A1* | 3/2011 | Norimatsu | H04B 1/0483 455/110 |
| 2011/0075034 | A1* | 3/2011 | Cowley | H04N 5/50 348/572 |
| 2011/0244819 | A1* | 10/2011 | Schlee | H01Q 3/267 455/226.1 |
| 2012/0027066 | A1* | 2/2012 | O'Keeffe | H01Q 1/246 375/224 |
| 2012/0082072 | A1 | 4/2012 | Shen | |

OTHER PUBLICATIONS

Written Opinion of the International Searching Authority for International Application No. PCT/SE2012/050465 mailed Apr. 29, 2013, 8 pages.

European Office Action corresponding to European Application No. 12 875 751.5-1852, dated Apr. 24, 2015; 6 pages.

EP office action in application No. 12875751.5 mailed Oct. 4, 2016.

* cited by examiner

RADIO COMMUNICATION RECEIVER APPARATUS AND METHOD

CROSS REFERENCE TO RELATED APPLICATION

This application is a 35 U.S.C. §371 national stage application of PCT International Application No. PCT/SE2012/050465, filed on 3 May 2012, the disclosure and content of which is incorporated by reference herein in its entirety. The above-referenced PCT International Application was published in the English language as International Publication No. WO 2013/165289 A1 on 7 Nov. 2013.

TECHNICAL FIELD

The present invention relates to a radio communication receiver apparatus for processing multiple radio frequency bands in a telecommunication system, and to a method performed in such an apparatus.

BACKGROUND

For many years the deployment of telecommunication systems, for different standards and many frequency bands, has been realized to a large extent by placing radio base stations (RBS) in cellular networks covering large areas. An important link in a traditional radio base station architecture is between the active parts of the system (that is the digital and analog components of the system) to the passive parts (such as the filters and antennas). This high-power analog radio-frequency (RF) link is critical in the sense that it sometimes requires long cables of high quality and large dimensions, in order keep the unavoidable signal quality losses and power losses to a minimum. Such links suffer from the disadvantage of having high costs.

There has been a recent change to integrate the power amplifier and other RF blocks more closely with the physical antenna in order to avoid this critical link, and has resulted in what is termed an integrated antenna unit (IAU). In order to implement a base station today with two or more frequency bands, several complete receivers are combined on the analogue side after a receiver filter.

Thus, when implementing receivers for multiple frequency bands, two or more receivers are implemented in the analogue domain, one receiver for each frequency band. FIG. 1 shows such a receiver having multiple analogue receivers, each analogue receiver adapted to convert a respective radio frequency band into base band, for subsequent analogue to digital processing.

This type of technology has a disadvantage in that the multi band receivers become bulky, and have low energy efficiency and increased manufacturing cost due to the fact that several complete RF receivers in the analogue domain are used to implement the multi band receivers.

SUMMARY

It is an aim of the present invention to provide a method and apparatus which obviate or reduce at least one or more of the of the disadvantages mentioned above.

According to a first aspect of the invention, there is provided a radio communication receiver apparatus operable to process multiple radio frequency bands in a telecommunication system. The apparatus comprises a plurality of digital receiver chains, wherein each digital receiver chain is coupled to receive a digital representation of the multiple radio frequency bands, including a particular radio frequency band for processing by the respective digital receiver chain. Each digital receiver chain comprises a digital receiver that is programmable to select a particular radio frequency band from the digital representation of the multiple radio frequency bands, and adapted to down convert the selected radio frequency band into a digital baseband signal associated with the particular radio frequency band.

This has the advantage of enabling a less bulky receiver apparatus to be provided for handling multiple frequency bands. For example, the use of the digital receiver chains, as defined above, enable common components to be shared. For example, since each digital receiver is programmable to select a particular radio frequency band from the "combined" signal it receives, it enables common components to be used upstream in the digital receiver apparatus, for example a common analogue to digital converter. Also, the digital receiver chains defined above enable calibration to be provided using a common calibration stage, as will be described later in the application.

According to another aspect of the present invention, there is provided a method in a radio communication receiver apparatus that is operable to process multiple radio frequency bands in a telecommunication system. The method comprises the steps of receiving in a plurality of digital receiver chains a digital representation of the multiple radio frequency bands, the multiple radio frequency bands including specific radio frequency bands for processing by the respective digital receiver chains, and selecting at each digital receiver chain a specific radio frequency band from the digital representation of the multiple radio frequency bands. At each digital receiver chain the selected radio frequency band is down converted into a digital baseband signal associated with the specific radio frequency band.

BRIEF DESCRIPTION OF THE DRAWINGS

For a better understanding of the present invention, and to show more clearly how it may be carried into effect, reference will now be made, by way of example only, to the following drawings in which.

DETAILED DESCRIPTION

The embodiments of the invention provide implementations of a multi band radio frequency (RF) receiver, that enable common components to be shared, and that enable built in calibration to be provided. The embodiments of the invention will be described in relation to using Direct Radio Frequency Technology (DRF) in the digital domain. It is noted, however, that other implementations of digital receiver apparatus may be used, which provide the same functions as discussed below.

Figure 1:
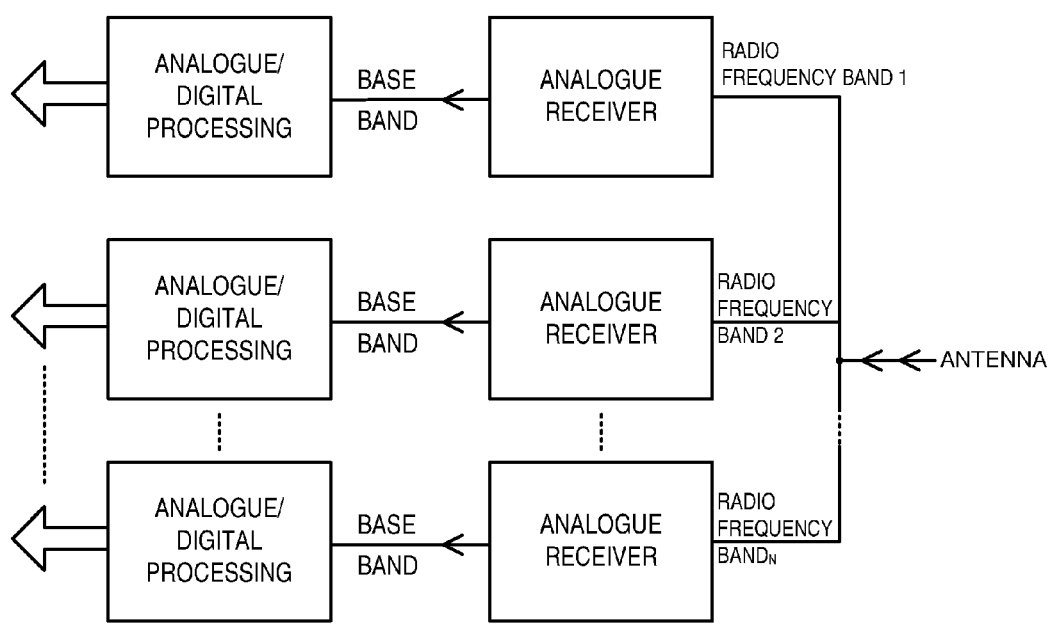
FIG. 1 shows a radio communication receiver apparatus according to the prior art.
Figure 2A:
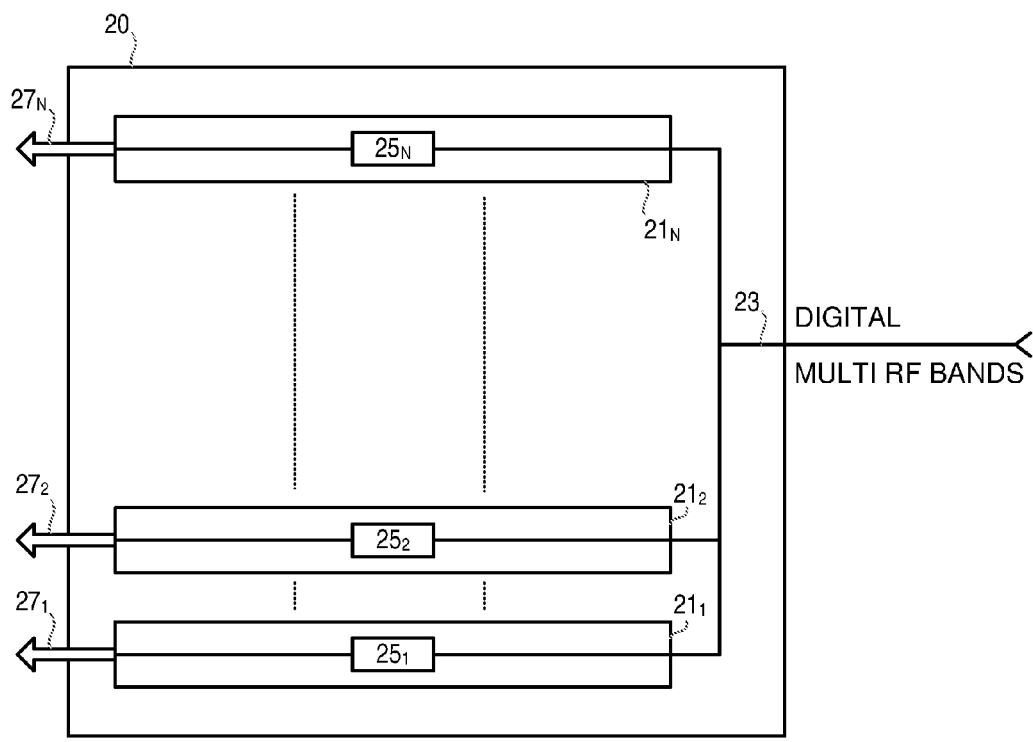
FIG. 2a shows a radio communication receiver apparatus according to an embodiment of the present invention.

FIG. 2a shows a radio communication receiver apparatus 20 according to an embodiment of the present invention. The radio communication receiver apparatus 20 is operable to process multiple radio frequency bands. The radio communication receiver apparatus 20 comprises a plurality of digital receiver chains $21_1$ to $21_N$. Each digital receiver chain $21_1$ to $21_N$ is coupled to receive a digital representation 23 of the multiple radio frequency bands, including a particular radio frequency band for processing by the respective digital receiver chain. The digital representation 23 may be subject to various processing techniques prior to being received by the plurality of digital receiver chains $21_1$ to $21_N$, as will be described further in relation to the other embodiments of the invention, later in the application.

Each digital receiver chain $21_1$ to $21_N$ comprises a digital receiver $25_1$ to $25_N$ that is programmable to select a particular radio frequency band from the digital representation 23 of the multiple radio frequency bands, and adapted to down convert the selected radio frequency band into a digital baseband signal $27_1$ to $27_N$ associated with the particular radio frequency band. For example, a digital receiver $25_1$ to $25_N$ of FIG. 2a (and the other embodiments described below) may comprise a digital receiver that is configured to down convert a directly sampled radio frequency signal to baseband, for example as described in co-pending patent application PCT/IB2010/002927 by the present applicant, also known as Direct Radio Frequency (DRF) technology.

The embodiment of FIG. 2a has the advantage of providing a frequency agnostic receiver. The apparatus enables a multi band, multi carrier and multi antenna receiver to be realized.

This also has the advantage of enabling a less bulky receiver apparatus to be provided for handling multiple frequency bands. For example, the use of the digital receiver chains as defined above enable common components to be shared. For example, since each digital receiver is programmable to select a particular radio frequency band from the "combined" signal it receives, it enables common components to be used upstream in the digital receiver apparatus, for example a common analogue to digital converter as will be described below, or built in calibration to be provided, also described later in the application.

A further advantage is that receiver linearization is no longer required when DRF receiver technology is used in this manner, since I/Q balancing problems no longer exist.

Figure 2B:
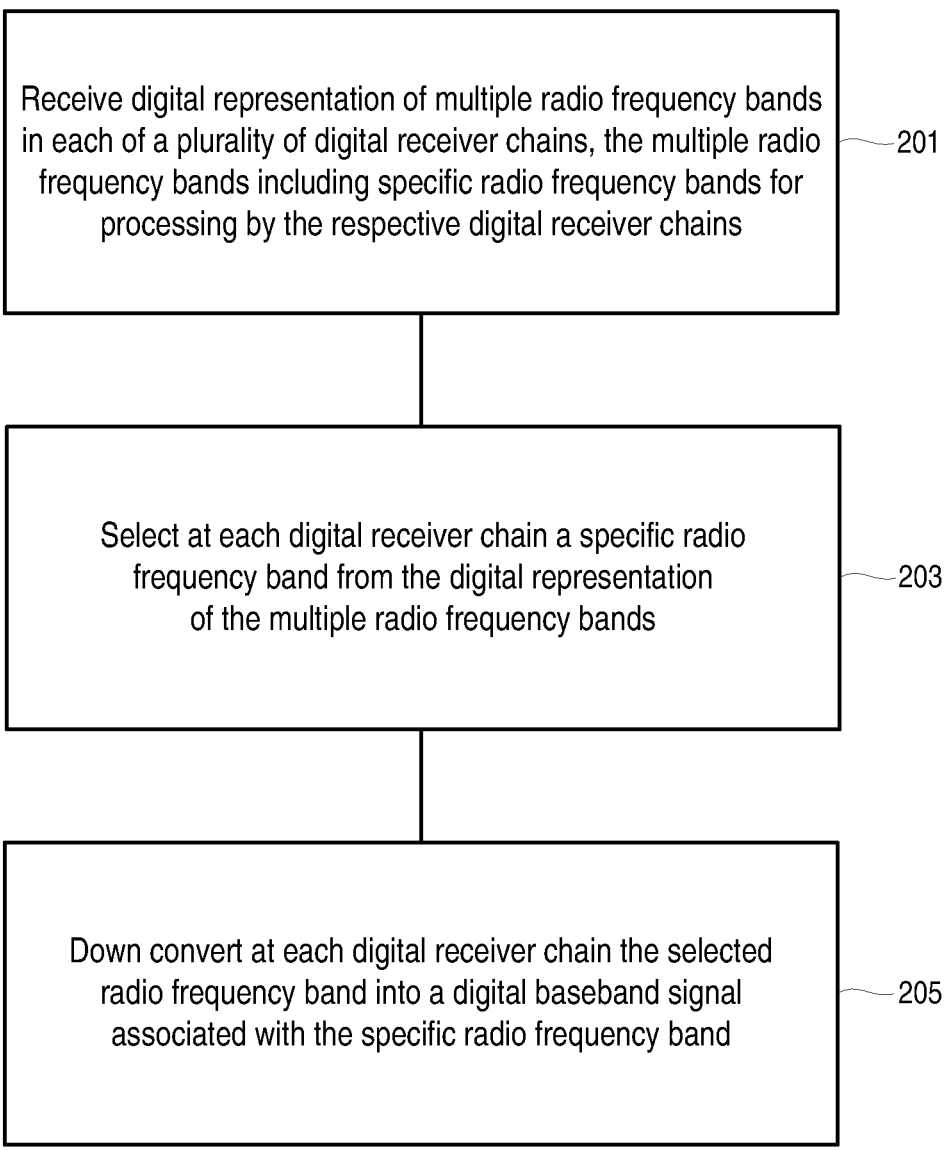
FIG. 2b shows the steps performed in a radio communication receiver apparatus according to an embodiment of the present invention.

FIG. 2b shows the steps performed by a radio communication receiver apparatus according to an embodiment of the present invention, the apparatus being operable to process multiple radio frequency bands. In step 201 the method comprises the step of receiving in a plurality of digital receiver chains $21_1$ to $21_N$ a digital representation 23 of the multiple radio frequency bands, the multiple radio frequency bands including specific radio frequency bands for processing by the respective digital receiver chains. In step 203, each digital receiver chain $21_1$ to $21_N$ selects a specific radio frequency band from the digital representation 23 of the multiple radio frequency bands. In step 205, each digital receiver chain $21_1$ to $21_N$ down converts the selected radio frequency band into a digital baseband signal $27_1$ to $27_N$ associated with the specific radio frequency band.

Figure 3:
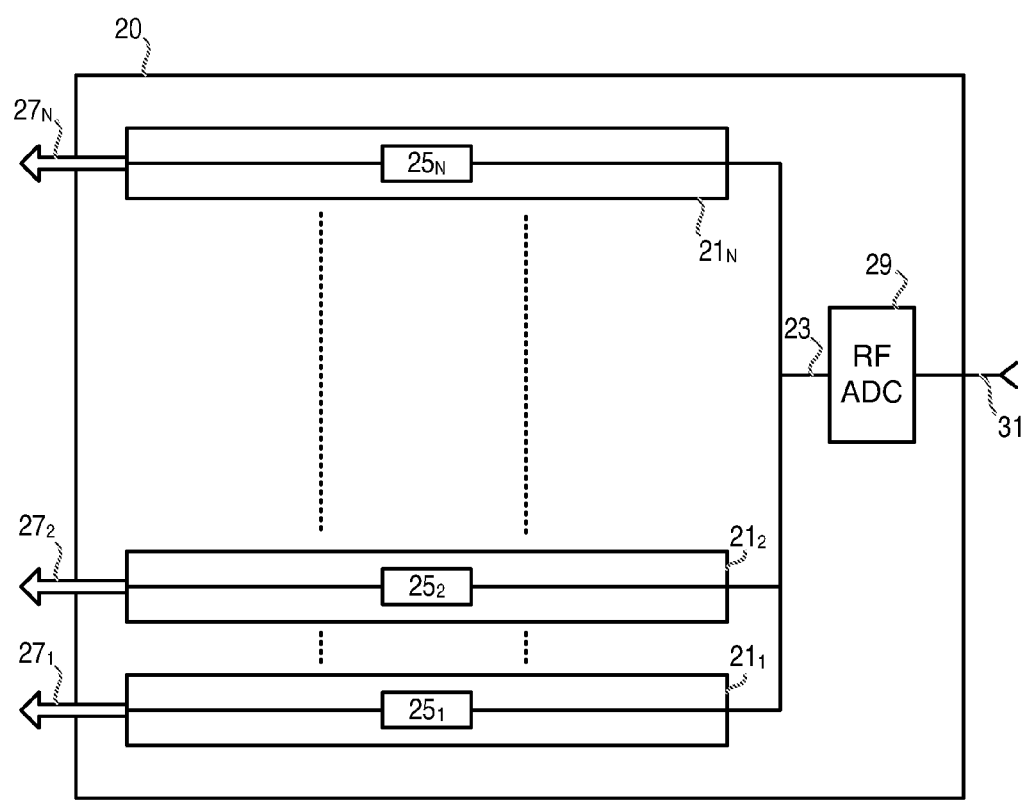
FIG. 3 shows a radio communication receiver apparatus according to another embodiment of the present invention.

FIG. 3 shows a radio communication receiver apparatus 20 according to another embodiment of the present invention. As with FIG. 2a, the radio communication receiver apparatus 20 comprises a plurality of digital receiver chains $21_1$ to $21_N$. Each digital receiver chain $21_1$ to $21_N$ is coupled to receive a digital representation 23 of the multiple radio frequency bands, including a particular radio frequency band for processing by the respective digital receiver chain. Each digital receiver chain $21_1$ to $21_N$ comprises a digital receiver $25_1$ to $25_N$ that is programmable to select a particular radio frequency band from the digital representation 23 of the multiple radio frequency bands, and adapted to down convert the selected radio frequency band into a digital baseband signal $27_1$ to $27_N$ associated with the particular radio frequency band. As mentioned above, a digital receiver $25_1$ to $25_N$ may comprise a digital receiver that is configured to down convert a directly sampled radio frequency signal to baseband, for example as described in patent application PCT/IB2010/002927.

The radio communication receiver apparatus 20 comprises an RF analogue to digital converter 29 coupled to receive an analogue signal 31 comprising the multiple radio frequency bands, and adapted to output the digital representation 23 of the multiple radio frequency bands to each digital receiver chain $21_1$ to $21_N$.

The RF analogue to digital converter 29 is preferably a high speed analogue to digital converter that it is capable of processing the multiple frequency band signals.

For example, the RF analogue to digital converter 29 may be configured to support a high sample rate at RF frequency, with the sample frequency preferably being at least the same as half the highest frequency of operation f_max for operation in the 1st Nyquist zone, the same as f_max when operating in the 2nd Nyquist zone and ⅔ f_max for operation in the 3rd Nyquist zone.

According to one embodiment the RF analogue to digital converter 29 is configured to work in a so called mixed mode that supports operation in at least the 1st and 2nd Nyquist zone, but possibly also the 3rd Nyquist zone. The RF analogue to digital converter 29 is driven with a fixed clock frequency, without any tuning or frequency shifting. The RF analogue to digital converter has a high dynamic range, i.e. high SFDR (Spurious free dynamic range) and low noise. By using a high speed RF analogue to digital converter there is no requirement for linearization of the receiver path normally used for I/Q balancing in homodyne receivers. As will be described in the embodiments below, prior to the ADC 29 a band pass filter can be provided in order to filter out unwanted signals outside the operating frequency band, for example unwanted signals such as noise.

The analogue signal 31 comprising the multiple radio frequency bands may be subject to various processing techniques prior to being received by the RF analogue to digital converter 29, as will be described further in relation to the other embodiments of the invention described later in the application. With the embodiment of FIG. 3 a common analogue to digital converter is therefore provided for processing the received analogue signal. This has the advantage of enabling a common component to be used, rather than multiple ADCs having multiple local oscillator tuning circuits, thereby saving bulk and cost.

Alternatively (not shown), in certain applications it may be desirable to provide an RF analogue to digital converter in each digital receiver chain, each RF analogue to digital converter being adapted to receive an analogue signal 31 comprising the multiple radio frequency bands, and adapted to output the digital representation 23 of the multiple radio frequency bands to its respective digital receiver chain $21_1$ to $21_N$. It is noted that the signals received by the RF analogue to digital receiver 29 (or receivers), for example from a combining unit as described below in FIG. 4, can be either a single ended or differential signal. In the case of a differential signal being received from such a combining unit, and a single ended ADC being used, or vice versa, an interface can be provided for converting between the two, for example a balun.

Figure 4:
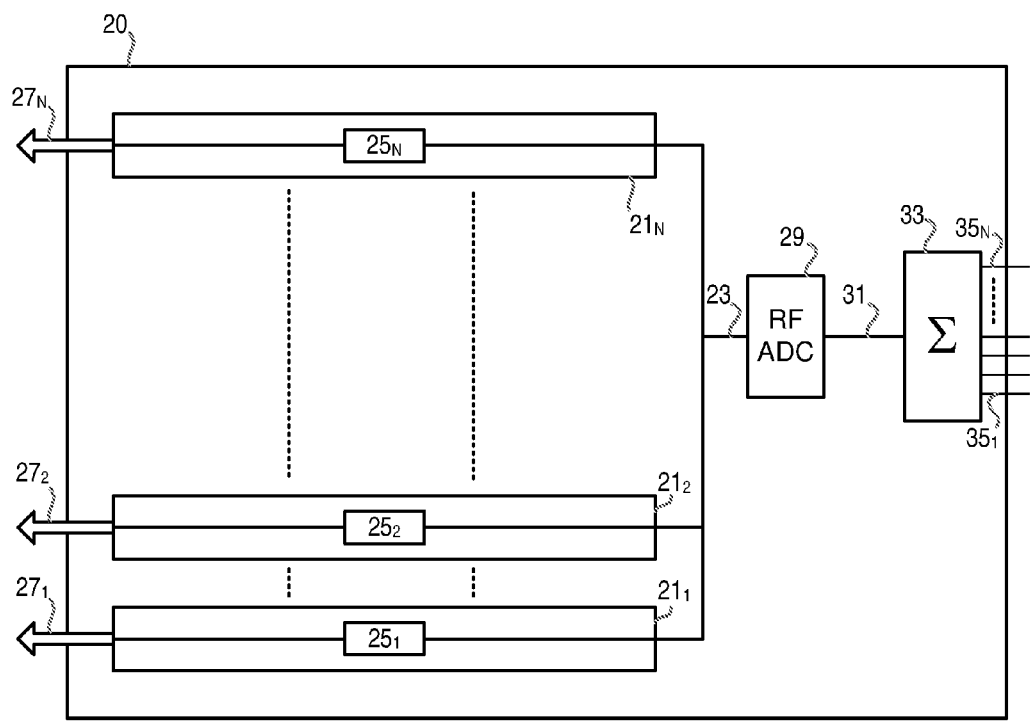
FIG. 4 shows a radio communication receiver apparatus according to another embodiment of the present invention.

FIG. 4 shows a radio communication receiver apparatus 20 according to another embodiment of the present invention. As with FIGS. 2a and 3, the radio communication receiver apparatus 20 comprises a plurality of digital receiver chains $21_1$ to $21_N$, each digital receiver chain $21_1$ to $21_N$ coupled to receive a digital representation 23 of the multiple radio frequency bands, including a particular radio frequency band for processing by the respective digital receiver chain. Each digital receiver chain $21_1$ to $21_N$ comprises a digital receiver $25_1$ to $25_N$ that is programmable to select a particular radio frequency band from the digital representation 23 of the multiple radio frequency bands, and adapted to down convert the selected radio frequency band into a digital baseband signal $27_1$ to $27_N$ associated with the particular radio frequency band. The radio communication receiver apparatus 20 comprises an RF analogue to digital converter 29 coupled to receive an analogue signal 31 comprising the multiple radio frequency bands, and adapted to output the digital representation 23 of the multiple radio frequency bands to each digital receiver chain $21_1$ to $21_N$.

The radio communication receiver apparatus 20 comprises a combining unit 33 coupled to receive a plurality of analogue radio frequency signals $35_1$ to $35_N$, and adapted to combine the plurality of analogue radio frequency signals $35_1$ to $35_N$ into a composite analogue signal 31 comprising multiple radio frequency bands for processing by the RF analogue to digital converter 29. As mentioned above, as an alternative to the common RF analogue to digital converter 29, separate analogue to digital converters may be provided in each digital receiver chain, each analogue to digital converter being adapted to receive a composite analogue signal 31 comprising the multiple radio frequency bands, and adapted to output the digital representation 23 of the multiple radio frequency bands to its respective digital receiver chain $21_1$ to $21_N$. As above, the signals received by the RF analogue to digital receiver 29 (or receivers) can be either a single ended or differential signal. In the case where the combining unit 33 is configured to output a differential signal and the ADC configured to receive a single ended signal ADC, or vice versa, an interface can be provided between the two in order to convert between the two types of signal, for example using a balun.

The multiple analogue radio frequency signals $35_1$ to $35_N$ may be subject to various processing techniques prior to being received by the combining unit 33, as will be described further in relation to the other embodiments of the invention described later in the application.

Figure 5:
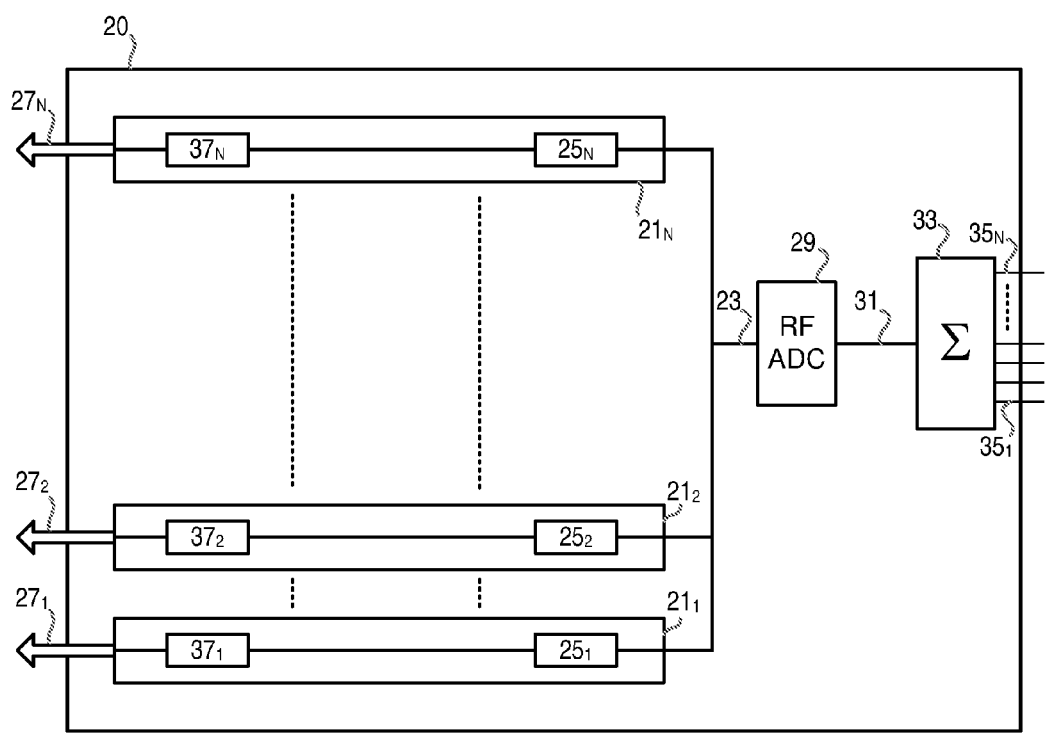
FIG. 5 shows a radio communication receiver apparatus according to another embodiment of the present invention.

FIG. 5 shows a radio communication receiver apparatus 20 according to another embodiment of the present invention. As with FIGS. 2a, 3 and 4, the radio communication receiver apparatus 20 comprises a plurality of digital receiver chains $21_1$ to $21_N$, each digital receiver chain $21_1$ to $21_N$ being coupled to receive a digital representation 23 of the multiple radio frequency bands, including a particular radio frequency band for processing by the respective digital receiver chain. Each digital receiver chain $21_1$ to $21_N$ comprises a digital receiver $25_1$ to $25_N$ that is programmable to select a particular radio frequency band from the digital representation 23 of the multiple radio frequency bands, and adapted to down convert the selected radio frequency band into a digital baseband signal $27_1$ to $27_N$ associated with the particular radio frequency band. The radio communication receiver apparatus 20 comprises an RF analogue to digital converter 29 coupled to receive an analogue signal 31 comprising the multiple radio frequency bands, and adapted to output the digital representation 23 of the multiple radio frequency bands to each digital receiver chain $21_1$ to $21_N$.

The radio communication receiver apparatus 20 comprises a combining unit 33 coupled to receive analogue radio frequency signals $35_1$ to $35_N$, and adapted to combine the multiple analogue radio frequency signals $35_1$ to $35_N$ into the analogue signal 31 comprising multiple radio frequency bands for processing by the RF analogue to digital converter 29. As mentioned above, as an alternative to the common RF analogue to digital converter 29, separate analogue to digital converters may be provided in each digital receiver chain, each RF analogue to digital converter being adapted to receive an analogue signal 31 comprising the multiple radio frequency bands, and adapted to output the digital representation 23 of the multiple radio frequency bands to its respective digital receiver chain $21_1$ to $21_N$.

Each digital receiver chain in the radio communication receiver apparatus 20 further comprises a digital processing unit $37_1$ to $37_N$ coupled to receive the output of a respective digital receiver $25_1$ to $25_N$, and adapted to process the digital signal to provide the digital baseband output signal $27_1$ to $27_N$. The digital processing units $37_1$ to $37_N$ are adapted to perform filtering and down conversion to base band.

This embodiment has the advantage of providing extended control of receiver behaviour due to digital domain processing.

According to one embodiment, the digital processing units $37_1$ to $37_N$ of each digital receiver chain may form part of a common digital processing unit that is common to all digital receiver chains $21_1$ to $21_N$. In other words, the digital processing units may either be separate units for each digital receiver chain, or part of a common processing unit that processes signals in each of the digital receiver chains.

Figure 6:
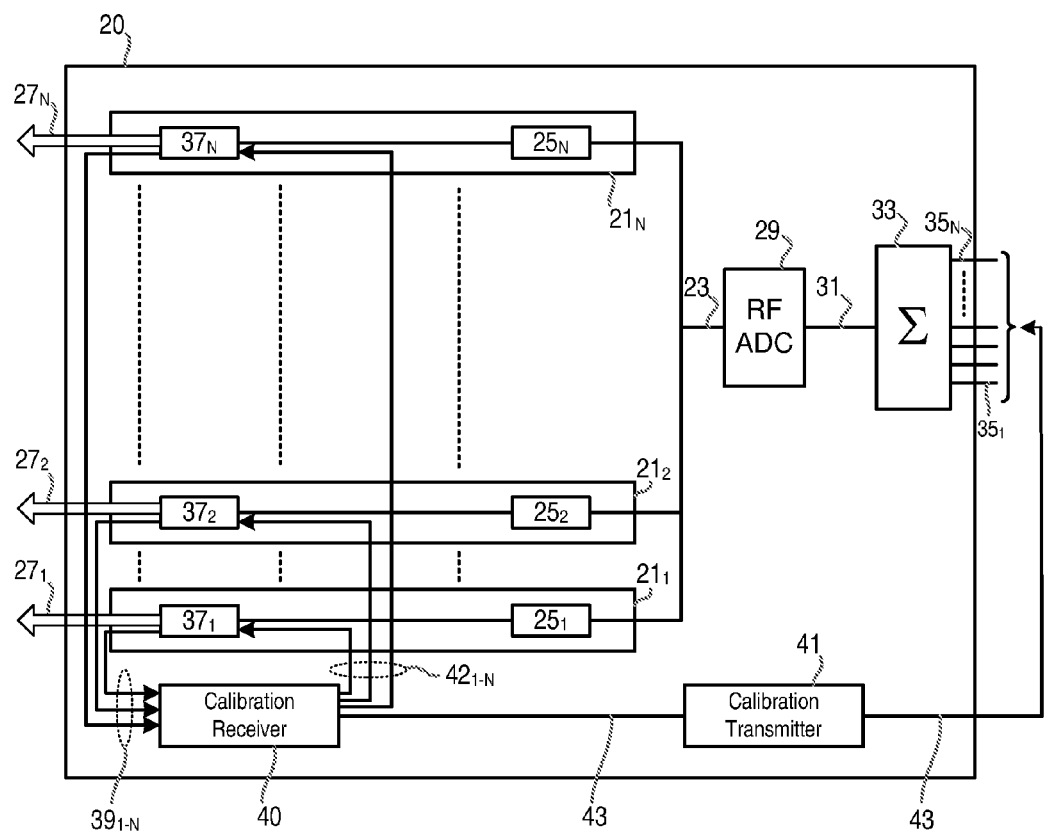
FIG. 6 shows a radio communication receiver apparatus according to another embodiment of the present invention.

FIG. 6 shows a radio communication receiver apparatus 20 according to another embodiment of the present invention. As with FIGS. 2a, 3, 4 and 5, the radio communication receiver apparatus 20 comprises a plurality of digital receiver chains $21_1$ to $21_N$, each digital receiver chain $21_1$ to $21_N$ coupled to receive a digital representation 23 of the multiple radio frequency bands, including a particular radio frequency band for processing by the respective digital receiver chain. Each digital receiver chain $21_1$ to $21_N$ comprises a digital receiver $25_1$ to $25_N$ that is programmable to select a particular radio frequency band from the digital representation 23 of the multiple radio frequency bands, and adapted to down convert the selected radio frequency band into a digital baseband signal $27_1$ to $27_N$ associated with the particular radio frequency band, for example using DRF technology. The radio communication receiver apparatus 20 comprises an RF analogue to digital converter 29 coupled to receive an analogue signal 31 comprising the multiple radio frequency bands, and adapted to output the digital representation 23 of the multiple radio frequency bands to each digital receiver chain $21_1$ to $21_N$.

The radio communication receiver apparatus 20 comprises a combining unit 33 coupled to receive analogue radio frequency signals $35_1$ to $35_N$, and adapted to combine the multiple analogue radio frequency signals $35_1$ to $35_N$ into the analogue signal 31 comprising multiple radio frequency bands for processing by the RF analogue to digital converter 29. As mentioned above, as an alternative to the common RF analogue to digital converter 29, separate analogue to digital converters may be provided in each digital receiver chain, each RF analogue to digital converter being adapted to receive an analogue signal 31 comprising the multiple radio frequency bands, and adapted to output the digital representation 23 of the multiple radio frequency bands to its respective digital receiver chain $21_1$ to $21_N$.

Each digital receiver chain in the radio communication receiver apparatus 20 comprises a digital processing unit $37_1$ to $37_N$ coupled to receive the output of a respective digital receiver $25_1$ to $25_N$, and adapted to process the digital signal to provide the digital baseband output signal $27_1$ to $27_N$. The digital processing units may either be separate units for each digital receiver chain, or part of a common processing unit that processes signals in each of the digital receiver chains.

The radio communication receiver apparatus 20 further comprises a calibration stage comprising a calibration receiver 40 and a calibration transmitter 41. The calibration stage is configured to correct the I and Q signals at a base band level, and in particular one or more of phase, amplitude or delay in the respective digital receiver chains in order to achieve RF coherence. The calibration receiver 40 is configured to generate a calibration signal 43 which is transmitted using the calibration transmitter 41 into the incoming signal path of the receiver 20, for example into an antenna (not shown) which feeds the combining unit 33. The same calibration signal is detected in each of the digital receiver chains $21_1$ to $21_N$ and coupled as a set of feedback signals, or measured signals $39_{1-N}$ to the input of the calibration receiver 40, thereby providing feedback signals to the calibration receiver 40. The calibration signal is detected or measured in each of the digital chains $21_1$ to $21_N$ using the plurality of digital processing units $37_1$ to $37_N$, with the measured signals $39_{1-N}$ being coupled to the input of the calibration receiver 40. The measured signals $39_{1-N}$ received by the calibration receiver 40 are compared with each other, for example using a MSR receiver, with one or more of phase, amplitude and delay parameters being calculated relative to one of the receiver signals. For example, according to one embodiment the phase, amplitude and delay of each of the received calibration signals are compared with one of the received calibration signals, for example all compared with the calibration signal received from the first digital receiver chain $21_1$. Correction parameters $42_{1-N}$ are then determined, and used to adjust the phase, amplitude and/or delay parameters of one or more of the respective outputs of the digital receivers $25_1$ to $25_N$, according to the result of the comparison step. The adjusting operation may comprise adding or subtracting correction parameters to the outputs of one or more of the digital receivers $25_1$ to $25_N$. For example, if the comparison process is made with respect to the output of digital receiver $25_1$, then correction parameters are added or subtracted to the phase, amplitude and/or delay of one or more of the output signals of digital receivers $25_2$ to $25_N$. By adjusting the phase, amplitude and/or delay parameters of one or more of the output signals of the digital receivers $25_1$ to $25_N$, this enables RF coherence to be achieved between the different digital receiver chains.

The calibration process can be run during a calibration mode of operation, during which the calibration signal 43 is used to determine what correction parameters, if any, are needed to the various digital receiver chains. These correction parameters are then used to correct the different frequency band signals based on the actual working of the various digital receiver chains. The calibration mode of operation can be run periodically, and the correction parameters set accordingly.

The calibration stage is therefore adapted, during a calibration mode of operation, to transmit a calibration signal to the input of the receiver apparatus, and adapted to detect the phase, amplitude and/or delay of the calibration signal after being converted to a baseband signal in each digital receiver chain ($21_1$ to $21_N$). The detected signal from each digital receiver chain provides a set of feedback signals for use by the calibration stage to define a set of correction parameters, wherein the set of correction parameters are used by the digital processing unit ($37_1$ to $37_N$) to adjust one or more of the phase, amplitude and/or delay of a base band signal in one or more of the digital receiver chains.

It can be seen that the calibration stage comprises a calibration transmitter for coupling the calibration signal to an input of the receiver, and a calibration receiver for receiving the set of feedback signals from each digital receiver chain, wherein the calibration receiver is adapted to compare the phase, amplitude and/or delay of each of the set of feedback signals, and determine the set of correction parameters based on the comparison.

Figure 7:
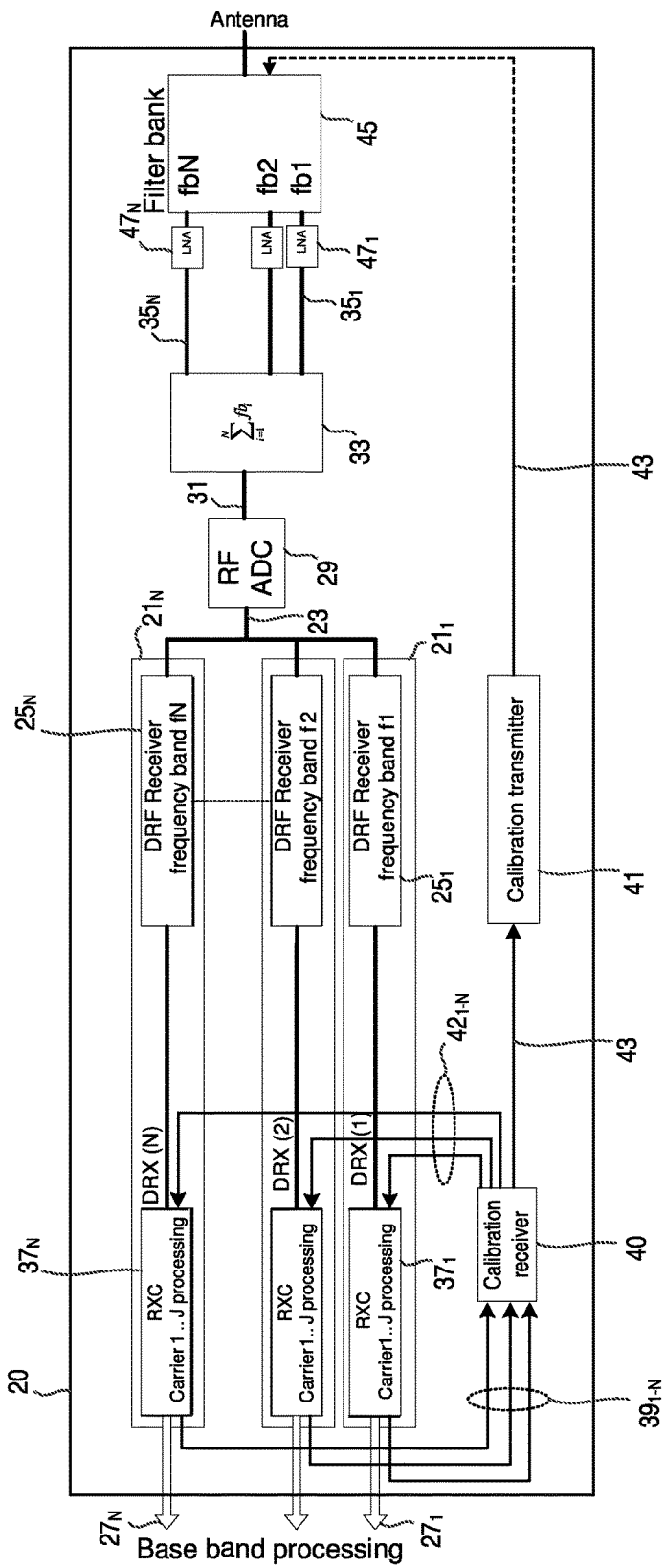
FIG. 7 shows a radio communication receiver apparatus according to another embodiment of the present invention.

FIG. 7 shows a radio communication receiver apparatus 20 according to another embodiment of the present invention. As with FIGS. 2a, 3, 4, 5 and 6, the radio communication receiver apparatus 20 comprises a plurality of digital receiver chains $21_1$ to $21_N$, each digital receiver chain $21_1$ to $21_N$ coupled to receive a digital representation 23 of the multiple radio frequency bands, including a particular radio frequency band for processing by the respective digital receiver chain. Each digital receiver chain $21_1$ to $21_N$ comprises a digital receiver $25_1$ to $25_N$ that is programmable to select a particular radio frequency band from the digital representation 23 of the multiple radio frequency bands, and adapted to down convert the selected radio frequency band into a digital baseband signal $27_1$ to $27_N$ associated with the particular radio frequency band. The radio communication receiver apparatus 20 comprises an RF analogue to digital converter 29 coupled to receive an analogue signal 31 comprising the multiple radio frequency bands, and adapted to output the digital representation 23 of the multiple radio frequency bands to each digital receiver chain $21_1$ to $21_N$.

The radio communication receiver apparatus 20 comprises a combining unit 33 coupled to receive analogue radio frequency signals $35_1$ to $35_N$, and adapted to combine the multiple analogue radio frequency signals $35_1$ to $35_N$ into the analogue signal 31 comprising multiple radio frequency bands for processing by the RF analogue to digital converter 29. As mentioned above, as an alternative to the common RF analogue to digital converter 29, separate RF analogue to digital converters may be provided in each digital receiver chain, each analogue to digital converter being adapted to receive an analogue signal 31 comprising the multiple radio frequency bands, and adapted to output the digital representation 23 of the multiple radio frequency bands to its respective digital receiver chain $21_1$ to $21_N$.

Each digital receiver chain in the radio communication receiver apparatus 20 comprises a digital processing unit $37_1$ to $37_N$ coupled to receive the output of a respective digital receiver $25_1$ to $25_N$, and adapted to process the digital signal to provide the digital baseband output signal $27_1$ to $27_N$. The digital processing units may either be separate units for each digital receiver chain, or part of a common processing unit that processes signals in each of the digital receiver chains.

The radio communication receiver apparatus 20 further comprises a calibration stage comprising a calibration receiver 40 and a calibration transmitter 41, as described above in FIG. 6. The calibration stage is configured to correct the I and Q signals at a base band level, and in particular one or more of phase, amplitude and/or delay in the respective digital receiver chains in order to achieve RF coherence.

The radio communication receiver apparatus 20 further comprises a filter unit 45. The filter unit 45 is configured to receive a radio signal including the multiple radio frequency bands, in analogue form, for example from one or more antennas. The filter unit 45 comprises a plurality of filters fb1 to fbN for separating the received radio signal into multiple analogue radio frequency signals $35_1$ to $35_N$. It is noted that these filters, for example bandpass filters, can be arranged as separate filters or as an array of switchable filters, in the filter unit or bank 45.

A plurality of amplifier units $47_1$ to $47_N$ can be provided (for example low noise amplifiers, LNAs), the plurality of amplifier units $47_1$ to $47_N$ being coupled to receive the multiple analogue radio frequency signals $35_1$ to $35_N$ and amplify the analogue radio frequency signals $35_1$ to $35_N$ prior to being combined by the combining unit 33. This has the advantage of improving the signal to noise level.

As an alternative for the separate amplifier units $47_1$ to $47_N$, a common amplifier unit 47 (such as a common LNA) may be provided instead of band specific amplifier units $47_1$ to $47_N$. In such an embodiment the summation or combining can be made by providing an RF combining unit at the input of the common amplifier unit 47 (for example at the input of a common LNA).

The embodiment above provides a receiver architecture that comprises N digital receiver (DRX) chains $21_1$ to $21_N$, comprising Receiver Carrier (RXC) processing blocks $37_1$ to $37_N$, and direct radio frequency receivers (RX-DRF blocks) $25_1$ to $25_N$, a common RF-ADC 29 for all digital receiver chains $21_1$ to $21_N$. The receiver comprises a filter bank 45 that defines the receiver frequency bands. For calibration a calibration stage is provided. In order to increase the dynamic range, it is noted that an RF analogue to digital converter could be used for each frequency band according to an alternative embodiment, and thus, in which case there is no need for received signals to be combined after the band filters, before connecting to each ADC.

The embodiment above also provides a digital receiver (DRX) block that comprises a carrier processing block that filters, and decimates the input signal to desired representation, normally represented as I,Q, of the output signal. The RX-DRF processing blocks down-convert the input RF signal directly to base band level.

The multi band receiver is therefore fed, by the combined RF signal from different carriers and frequency bands, from the LNA and filter block. The RF signal is digitized by means of the ADC and the digitized RF signal is then fed a RX DRF chain where down conversion to base band is performed. The output from the receiver is a digitized representation of the base band signal that is fed into the common hardware block for RXC processing where channel filtering and calibration is performed. The digital output, normally represented as I,Q samples is fed into a waveform processing block. The calibration parameters are derived in the calibration stage. There is one RX DRF and DRX chain for each frequency band and antenna.

The embodiments of the invention have the advantage of providing power efficiency due to common component utilization.

It is noted that, in each of the embodiments described above, an image reject filter may be inserted after the combining unit 33 (i.e. after the summation block) and prior to the RF analogue to digital converter 29. The image rejection filter is configured to remove signals and noise from the non-used Nyquist zones.

The embodiments also provide the advantages of enabling a frequency agnostic receiver to be realised, and provide a multi band, multi carrier and multi antenna receiver. The embodiments have a high dynamic range by the extended control of receiver behaviour due to digital domain processing and built in calibration.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. A radio communication receiver apparatus configured to process multiple radio frequency bands in a telecommunication system, the radio communication receiver apparatus comprising:
   a plurality of digital receiver chains, wherein each digital receiver chain comprises:
      a digital receiver coupled to receive a combined digital representation of the multiple radio frequency bands and wherein each digital receiver is programmable to select a particular radio frequency band from the combined digital representation of the multiple radio frequency bands, and
      a digital processing circuit coupled to receive an output of each digital receiver, the digital processing circuit being configured to down convert the particular radio frequency band into a digital baseband signal associated with the particular radio frequency band;
   a calibration stage comprising a calibration transmitter and a calibration receiver, wherein the calibration stage is configured during a calibration mode of operation to transmit a calibration signal to an input of the radio communication receiver apparatus, and configured to detect a phase, amplitude, and delay of the calibration signal after being converted to a digital baseband signal in each digital receiver chain, the detected signal from each digital receiver chain providing a set of feedback signals for use by the calibration stage to define a set of correction parameters, wherein the set of correction parameters are used by the digital processing circuit to adjust one or more of the phase, amplitude, and delay of the digital baseband signal in one or more of the digital receiver chains,
   wherein the calibration transmitter couples the calibration signal to the input of the radio communication receiver apparatus and the calibration receiver receives the set of feedback signals from each digital receiver chain, and
   wherein the calibration receiver is configured to compare the phase, amplitude, and delay of each of the set of feedback signals, and determine the set of correction parameters based on the comparison; and
   a radio frequency (RF) analogue to digital converter coupled to receive an analogue signal comprising the multiple radio frequency bands, and configured to output the combined digital representation of the multiple radio frequency bands to each digital receiver chain, wherein the RF analogue to digital converter has a high spurious free dynamic range thereby eliminating a need for linearization in the radio communication receiver apparatus.

2. The radio communication receiver apparatus as claimed in claim 1, wherein the RF analogue to digital converter is a high speed analogue to digital converter.

3. The radio communication receiver apparatus as claimed in claim 1, further comprising a combining circuit coupled to receive multiple analogue radio frequency signals, and configured to combine the multiple analogue radio frequency signals into the analogue signal comprising the multiple radio frequency bands for processing by the RF analogue to digital converter.

4. The radio communication receiver apparatus as claimed in claim 3, further comprising a filter circuit, wherein the filter circuit is configured to receive a radio signal including the multiple radio frequency bands, the filter circuit comprising a plurality of filters for separating the received radio signal into the multiple analogue radio frequency signals, for coupling to an input of the combining circuit.

5. The radio communication receiver apparatus as claimed in claim 4, further comprising a plurality of amplifier circuits, the plurality of amplifier circuits coupled to receive the multiple analogue radio frequency signals and amplify the multiple analogue radio frequency signals prior to being combined by the combining circuit.

6. The radio communication receiver apparatus as claimed in claim 1, wherein the digital processing circuit forms part of a common digital processing circuit that is common to the plurality of digital receiver chains.

7. The radio communication receiver apparatus as claimed in claim 1, wherein the RF analogue to digital converter is provided in each digital receiver chain, each RF analogue to digital converter being configured to receive an analogue signal comprising the multiple radio frequency bands, and configured to output the combined digital representation of the multiple radio frequency bands to its respective digital receiver chain.

8. The radio communication receiver apparatus as claimed in claim 1, wherein the digital processing circuit is configured to down convert a directly sampled radio frequency signal to the digital baseband signal.

9. A method in a radio communication receiver apparatus that is configured to process multiple radio frequency bands in a telecommunication system, the method comprising the steps of:
receiving, by a digital receiver in each of a plurality of digital receiver chain, a combined digital representation of the multiple radio frequency bands from a radio frequency (RF) analogue to digital converter, wherein the RF analogue to digital converter has a high spurious free dynamic range thereby eliminating a need for linearization in the radio communication receiver apparatus;
selecting, by the digital receiver in each of the plurality of digital receiver chain, a specific radio frequency band from the combined digital representation of the multiple radio frequency bands;
down converting, by a digital processing circuit on receiving an output from the digital receiver in each of the plurality of digital receiver chain, the specific radio frequency band into a digital baseband signal associated with the specific radio frequency band; and
operating the radio communication receiver apparatus in a calibration mode to determine a set of correction parameters for adjusting one or more of a phase, amplitude, and delay of the digital baseband signal in one or more of the digital receiver chains, wherein the operating the radio communication receiver apparatus in a calibration mode comprises:
transmitting, by a calibration transmitter, a calibration signal to an input of the radio communication receiver apparatus,
detecting, by the digital processing circuit, a phase, amplitude, and delay of the calibration signal after being converted to a digital baseband signal in each digital receiver chain,
receiving, by a calibration receiver, a set of feedback signals based on the detection,
comparing, by the calibration receiver, a phase, amplitude, and delay of each of the set of feedback signals to determine the set of correction parameters based on the comparison.

10. The method as claimed in claim 9, wherein prior to the step of receiving the combined digital representation of the multiple radio frequency bands, the method further comprises the steps of receiving an analogue signal comprising the multiple radio frequency bands, and converting the analogue signal into the combined digital representation of the multiple radio frequency bands for receipt by each of the plurality of digital receiver chains.

11. The method as claimed in claim 10, wherein prior to the converting step, the method further comprises the steps of combining multiple analogue radio frequency signals received from at least one antenna into the analogue signal comprising the multiple radio frequency bands for processing during the converting step.

12. The method as claimed in claim 11, wherein prior to the step of combining, the method comprises the step of filtering a received radio signal including the multiple radio frequency bands into the multiple analogue radio frequency signals.

13. The method as claimed in claim 12, further comprising the step of amplifying the multiple analogue radio frequency signals prior to the combining step.

14. The method as claimed in claim 9, wherein the step of down converting comprises the steps of digitally processing the specific radio frequency bands at each digital receiver chain.

15. The method as claimed in claim 14, wherein the steps of digitally processing the specific radio frequency bands is performed by a digital processing circuit common to each digital receiver chain.

* * * * *